United States Patent [19]

Avenier et al.

[11] Patent Number: 5,060,261
[45] Date of Patent: Oct. 22, 1991

[54] MICROCIRCUIT CARD PROTECTED AGAINST INTRUSION

[75] Inventors: Jean-Pierre Avenier, Trets; Gilles Lisimaque; Philippe Maes, both of Peynier; Jacek Kowalski, Trets, all of France

[73] Assignee: Gemplus Card International, Gemenos, France

[21] Appl. No.: 551,550

[22] Filed: Jul. 11, 1990

[30] Foreign Application Priority Data

Jul. 13, 1989 [FR] France .................. 89 09549

[51] Int. Cl.$^5$ .............. G11B 23/28; G06K 19/02
[52] U.S. Cl. .................. 380/3; 206/806; 235/488; 235/492
[58] Field of Search .......... 380/3, 4; 206/806; 235/488, 492

[56] References Cited

U.S. PATENT DOCUMENTS

| 4,465,901 | 8/1984 | Best ........................ 380/4 |
| 4,691,350 | 9/1987 | Kleijne et al. ............ 380/3 |
| 4,783,801 | 11/1988 | Kaule ...................... 380/4 |
| 4,811,288 | 3/1989 | Kleijne et al. ............ 380/4 |
| 4,860,351 | 8/1989 | Weingart .................. 380/3 |

FOREIGN PATENT DOCUMENTS

| 268882 | 6/1988 | European Pat. Off. . |
| 3023427 | 1/1981 | Fed. Rep. of Germany . |
| 2580834 | 10/1986 | France . |
| 2195478 | 4/1988 | United Kingdom . |

Primary Examiner—Stephen C. Buczinski
Attorney, Agent, or Firm—Roland Plottel

[57] ABSTRACT

The microcircuit card is such that at least one strain-indicating sensor is placed on the microcircuit, in a known state of strain, and is maintained in this state by a protection layer deposited on the microcircuit for as long as this layer is not affected. The microcircuit has means for measuring an electrical value that is characteristic of the strain, and a logic circuit connected to the measuring means to detect the changes in the condition of strain indicating an intrusion into the card.

7 Claims, 1 Drawing Sheet

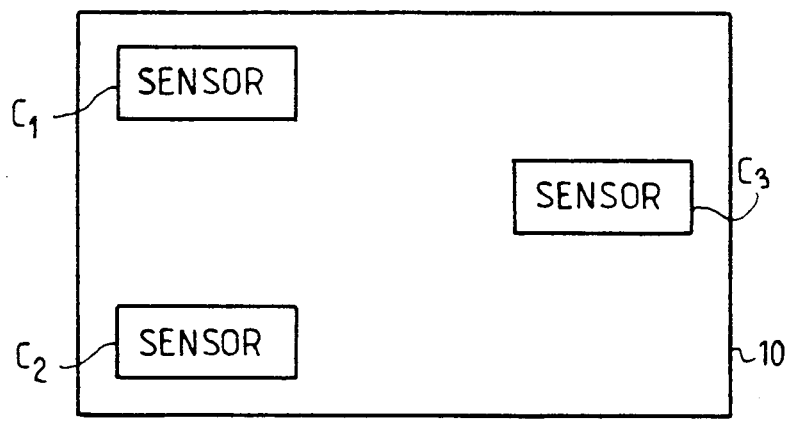
FIG_1
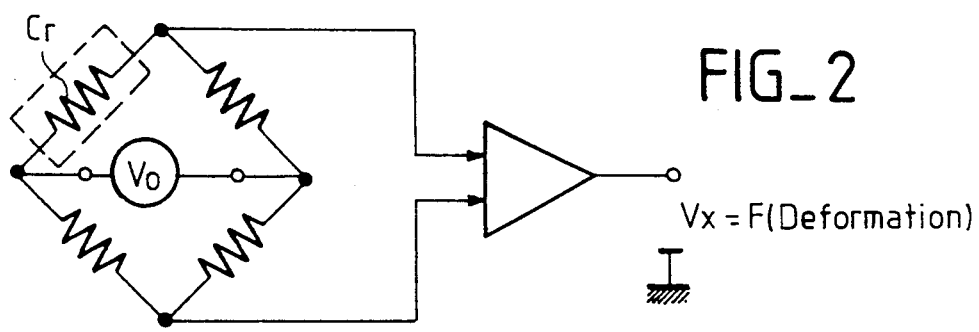
FIG_2
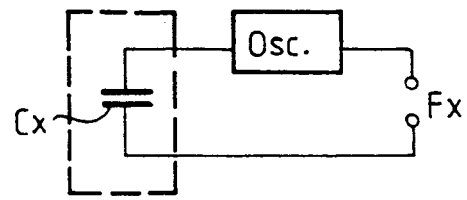
FIG_3
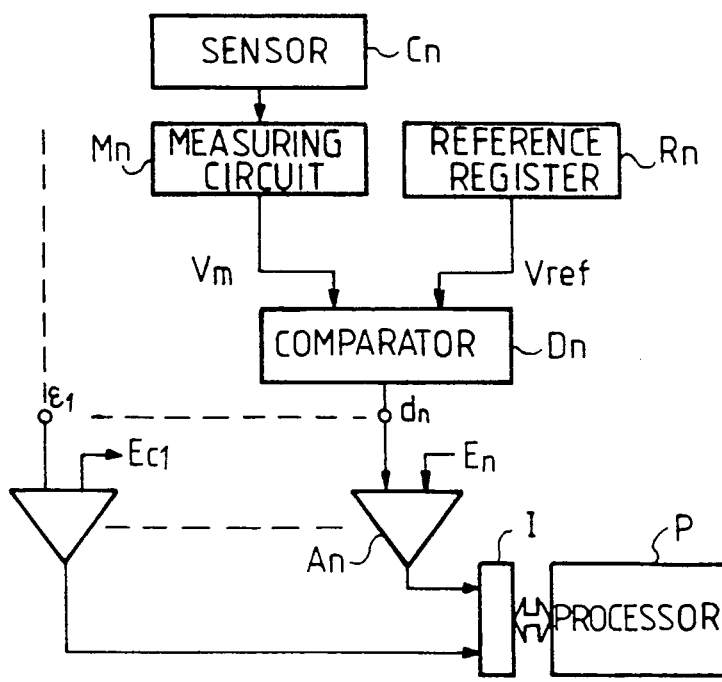
FIG_4

MICROCIRCUIT CARD PROTECTED AGAINST INTRUSION

BACKGROUND OF THE INVENTION

The invention pertains to microcircuit cards and, more particularly, the object of the invention is microcircuit cards, protected against intrusion. Microcircuit cards are chiefly used as media for the storage of information that is often confidential, notably codes giving access to services. To ensure the requisite security of operation, it is essential for such microcircuit cards to be protected against intrusion by dishonest individuals who seek to violate the confidentiality of the information that these cards may carry. The means of observation that dishonest individuals might use are either static means wherein the card is observed without any active means of intrusion, or dynamic means wherein the card is observed by simulating the conditions of its operation.

A known way of protecting the stored items of information against intrusion by static means lies in "concealing" them to the maximum extent in the microcircuit. By contrast, there is no method, to date, of protection against an intrusion where "dynamic" observation means are used.

An object of the invention is a microcircuit card protected against intrusion by dynamic means.

SUMMARY OF THE INVENTION

According to the invention, there is proposed a microcircuit card protected against intrusion, wherein at least one strain-indicating sensor is inserted in a characteristic artificial prestressed state, this state of strain being destroyed by any attempt to take the microcircuit out of the card.

BRIEF DESCRIPTION OF THE DRAWING

The invention will be understood more clearly and other characteristics will appear from the following description, made with reference to the appended drawing, wherein:

FIG. 1 shows a microcircuit card according to the invention, provided with three sensors;

FIGS. 2 and 3 show two examples of usable sensors;

FIG. 4 illustrates the circuit associated with the sensors for the detection of intrusion.

DETAILED DESCRIPTION OF THE INVENTION

The invention uses the fact that, for an intrusion using dynamic means, the dishonest individual must necessarily remove the electronic component from the micromodule or from the card that supports it, in order to place it under the observation instrument. Now, usually, when the electronic component is inserted in the card or in the micromodule which is itself inserted in the card, the "active" face of the component, on the implantation or diffusion side, can still be seen. After having been fixed to the micromodule, the component is therefore covered with a protection layer aimed at protecting it against any mechanical aggression. During an attempted intrusion, this protective layer is necessarily damaged by the dishonest individual who wants to reach the microcircuit. As a consequence, the microcircuit according to the invention is such that an element to detect the damage affecting the protective layer is inserted in the card so that, upon an attempted intrusion, the card can decide not to function and/or to inform the service station with which it has to cooperate that an intrusion has been made into this card.

For this purpose, firstly a sensor enabling the detection of a mechanical strain in the microcircuit is inserted into the card and, secondly, at the same time as the microcircuit is covered with its protection layer, a stress is applied to the microcircuit and maintained for as long as the drying operation lasts: the strain resulting from the stress then persists after the drying. This prestress may preferably be obtained naturally. To this end, the protection layer is applied in the form of a hot drop that is cooled very fast. During this cooling, the hardened resin of this drop exerts the prestress. In another method, the integrated circuit is also carried to high temperature. During the cooling of the drop and of the circuit, differential expansions induce the desired prestress. From this moment onwards, the strain-indicating sensor, accessible by the internal logic of the microcircuit, is in a state that can be measured by an electrical value, indicating that the protection layer is present. If a dishonest individual tries to make a microcircuit work after having damaged the protection layer in order to remove this microcircuit from the card, the measurement given by the sensor corresponds to a lack of strain in the circuit, and this sensor informs the internal logic circuit of the circuit that there is this absence of strain. This logic circuit then prevents any normal operation.

The sensor may be of the same type as the constituent elements of strain gauges or pressure sensors using piezo-electrical effects. It is connected to an indicator, a RAM memory position or flag testable in the component, that changes its state depending on whether or not the microcircuit is subjected to a mechanical stress and depending on whether the software, or the automaton, governs the working of the microcircuit tested at each new stage of use.

The microcircuit may be associated with several elementary sensors, each associated with an indicator: in this case, the internal logic of the circuit tests all the indicators associated with the sensors. It is then possible, during the manufacture of the card, to place only some of the sensors under stress, the others being left free of any stress so as to make it more difficult to create a possible reproduction of the states of strain.

Furthermore, for certain self-adaptable microcircuits having a saved memory (EEPROM, EPROM or saved RAM) it is possible to memorize the values of all the indicators borne by the component just after manufacture, in order to keep these values as reference values used, subsequently, by the internal logic circuit. Thus it is possible to obtain and use different reference values associated with differents states of strain from one component to the other, without modifying the component manufacturing cycle.

FIG. 1 illustrates an embodiment comprising three sensors $C_1$, $C_2$ and $C_3$ on a microcircuit 10, the outputs of these sensors being directly connected to the internal logic (not shown) of the microcircuit. This assembly is then covered with the protection layer.

FIG. 2 shows the equivalent diagram of a first embodiment of a resistive strain-indicating sensor Cr inserted in a measuring bridge, of the Wheatstone bridge type, in which the output voltage Vx is a function F of the deformation when the reference voltage Vo is applied between the inputs.

FIG. 3 shows the equivalent diagram of a second embodiment of a strain-indicating sensor, of the capacitive type in which: the value of the capacitance Cx varies with the stress applied and the frequency of the output signal Fx, directly linked to the capacitance Cx of the sensor, varies with the deformation.

FIG. 4 illustrates an embodiment of a logic circuit, internal to the microcircuit, associated with a set of sensors provided for on this microcircuit. Each sensor such as Cn is connected to a measuring circuit Mn that gives a measured value Vm (voltage or frequency for example) which is a function of the deformation. An associated reference register Rn has the initial value in the presence of deformation, memorized during the manufacture of the circuit. These two values are transmitted to a comparator Dn which gives their difference dn to a threshold amplifier An which also receives the maximum tolerated value En for the difference at this sensor.

When dn exceeds En, the amplifier activates a change in state of the corresponding stage of a register of indicators I tested by the internal processor P of the microcircuit during each use of the circuit.

The invention is restricted neither to the embodiment described nor to the examples of sensors shown. In particular, only one sensor may be provided for on the microcircuit or, on the contrary, there may be a greater number of sensors, and they may be arranged on the circuit in a configuration that is different from the one shown. Furthermore, to convert the deformations into electrical values, the sensors may generate variations in capacitance, frequency or resistance.

What I claim is:

1. A card comprising a microcircuit protected against intrusion by a protection layer, wherein at least one strain-indicating sensor is placed on the microcircuit, said microcircuit being in a known state of artificial prestress, this state of prestress being maintained by said protection layer deposited on said microcircuit, and this state of prestress being modified by any attempt to remove the microcircuit from the card, the microcircuit including an internal logic circuit connected to the terminals of the sensor to detect the changes in this state of prestress.

2. A card according to claim 1, wherein several sensors are distributed on the surface of the microcircuit.

3. A card according to one of the claims 1 and 2, wherein the sensor is a pressure-sensing element of the piezo-electrical type.

4. A card according to one of the claims 1 and 2, wherein the sensor comprises an element of the resistive type sensitive to deformation, and is associated with a resistance measuring circuit.

5. A card according to one of the claims 1 and 2, wherein the sensor comprises an element of the capacitive type sensitive to deformation, and is associated with a frequency measuring circuit.

6. A card according to one of the claims 1 and 2, wherein the internal logic circuit includes a register of indicators having as many stages as there are sensors on the microcircuit, said register being connected to the processor of the microcircuit which activates its testing before each use.

7. A card according to claim 6, wherein the internal logic circuit includes, between the output of a measuring circuit associated with a sensor and the stage corresponding to the register, a comparator which is also connected to a reference register and has its output coupled to an amplifier to activate a change in state when the difference at the output of the comparator is greater than a tolerated difference.

* * * * *